(12) United States Patent
Narita

(10) Patent No.: US 6,777,723 B1
(45) Date of Patent: Aug. 17, 2004

(54) SEMICONDUCTOR DEVICE HAVING PROTECTION CIRCUIT IMPLEMENTED BY BIPOLAR TRANSISTOR FOR DISCHARGING STATIC CHARGE CURRENT AND PROCESS OF FABRICATION

(75) Inventor: Kaoru Narita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/421,273

(22) Filed: Oct. 20, 1999

(30) Foreign Application Priority Data

Oct. 23, 1998 (JP) .......................................... 10-302893

(51) Int. Cl.⁷ .......................................... H01L 21/332
(52) U.S. Cl. ........................ 257/173; 257/378; 257/577
(58) Field of Search ................................ 257/173, 378, 257/577

(56) References Cited

U.S. PATENT DOCUMENTS

| | | | | |
|---|---|---|---|---|
| 5,101,257 A | * | 3/1992 | Hayden et al. | 257/368 |
| 5,498,885 A | * | 3/1996 | Deen et al. | 257/139 |
| 5,559,352 A | * | 9/1996 | Hsue et al. | 257/328 |
| 5,717,241 A | * | 2/1998 | Malhi et al. | 257/378 |
| 5,804,476 A | * | 9/1998 | Jang | 438/202 |
| 6,124,618 A | * | 9/2000 | Wong et al. | 257/370 |
| 6,355,508 B1 | * | 3/2002 | Porter et al. | 438/140 |

FOREIGN PATENT DOCUMENTS

| | | |
|---|---|---|
| JP | 7-29987 | 1/1995 |
| JP | 10-229132 | 8/1998 |

OTHER PUBLICATIONS

Steven H. Voldman et al., "Shallow Trench Isolation Double-Diode Electrostatic Discharge Circuit and Interaction with Dram Output Circuitry", EOS/ESD Symposium, pp. 5B.7.1–5B.7.12., Date unknown.

* cited by examiner

Primary Examiner—George Fourson
Assistant Examiner—Joannie Adelle Garcia
(74) Attorney, Agent, or Firm—Sughrue Mion, PLLC

(57) ABSTRACT

A protection circuit prevents a circuit component from static charge unavoidably applied to a signal terminal, and includes a vertical bipolar transistor having an n-type deep well serving as an emitter region, a p-type well formed on the n-type deep well and serving as a base region and an n-type impurity region formed in the p-type well and serving as a collector region so as to reduce a base resistance regardless of a shallow trench isolation.

29 Claims, 11 Drawing Sheets

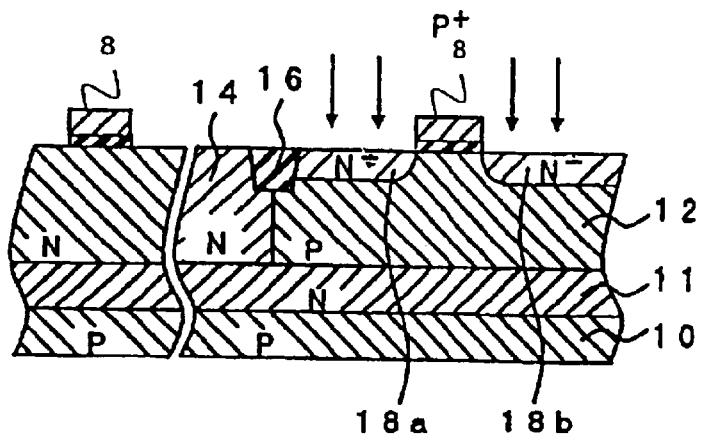
Fig. 17E
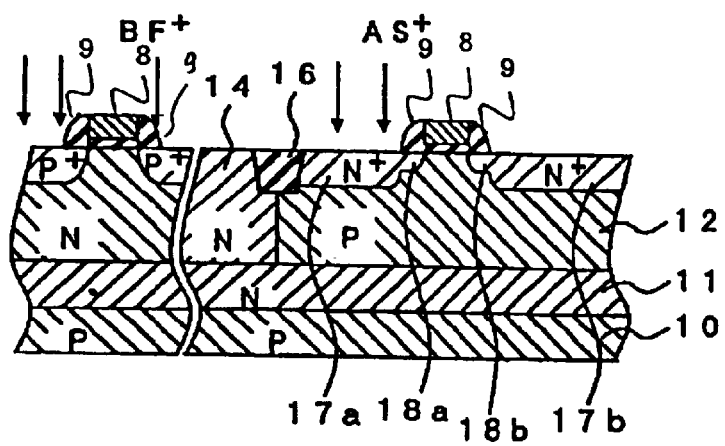
Fig. 17F
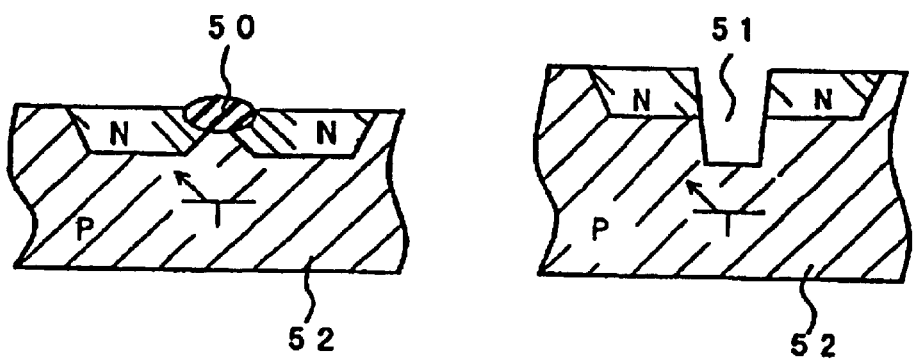
Fig. 1A
PRIOR ART
Fig. 1B
PRIOR ART

SEMICONDUCTOR DEVICE HAVING PROTECTION CIRCUIT IMPLEMENTED BY BIPOLAR TRANSISTOR FOR DISCHARGING STATIC CHARGE CURRENT AND PROCESS OF FABRICATION

FIELD OF THE INVENTION

This invention relates to a semiconductor integrated circuit device and a process for fabricating a semiconductor integrated circuit device and, more particularly, to a semiconductor integrated circuit device having a protection circuit implemented by a bipolar transistor and a process for fabricating it.

DESCRIPTION OF THE RELATED ART

The integration density of a semiconductor integrated circuit device has been increased, and, accordingly, the circuit components have been miniaturized. Circuit components of an integrated circuit are usually isolated as shown in FIG. 1A. The standard isolation is achieved by an insulating layer 50 grown along a boundary area between n-type impurity regions formed in a p-type silicon substrate 52. However, the standard isolation can not sufficiently isolate the miniature circuit components, and a shallow trench isolation is used for the miniature circuit components. The shallow trench isolation is shown in FIG. 1B. The p-type silicon substrate 52 is partially removed so that a shallow trench 51 is formed in the boundary area between the n-type impurity regions. Though not shown in FIG. 1B, the shallow trench is filled with insulating material, and the insulating material isolates the n-type impurity regions from one another.

Static charge is liable to destroy the miniature circuit components, and a protection circuit is incorporated in the semiconductor integrated circuit device against the static charge. A lateral n-p-n type bipolar transistor is a circuit component of the protection circuit, and has an n-type emitter region and an n-type collector region laterally spaced from each other. The surface portion of the p-type silicon substrate serves as a p-type base region between the n-type emitter region and the n-type collector region. Thus, the lateral n-p-n type bipolar transistor has the structure similar to that shown in FIG. 1B. When the n-type emitter region is isolated from the n-type collector region by means of the shallow trench isolation, the insulating material in the shallow trench increases the effective base width, and the wide base width causes the clamp voltage to be high. As a result, when the static charge is applied, the lateral n-p-n type bipolar transistor does not promptly turn on, and the static charge tends to reach the circuit components of an integrated circuit to be protected by the protection circuit.

A solution is proposed in Proceedings of EOS/ESD Symposium, 1992, pages 277 to 288. FIG. 2 illustrates the prior art vertical diode disclosed in the Proceedings. Reference numeral 70 designates a p-type silicon substrate. Two n-type wells 71 and 72 are formed in the p-type silicon substrate 70, and are spaced from one another. Shallow trench isolations 73 are employed in the prior art vertical diode. A single n-type impurity region 74 and two n-type impurity regions 74 are formed in a surface portion of the n-type well 71 and a surface portion of the other n-type well 72, respectively, and a p-type impurity region 75 is formed in a surface portion of the n-type well 72 between the n-type impurity regions 74 in the n-type well 72. A p-type impurity region 75 is further formed in a surface portion of the p-type silicon substrate 70 between the n-type well 71 and the other n-type well 72. The shallow trench isolations 73 are provided between the p-type silicon substrate 70, the n-type impurity region 74, the p-type impurity region 75, the n-type impurity region 74, the p-type impurity region 75, the n-type impurity region 74 and the p-type silicon substrate 70.

A power supply line PW is connected to the n-type impurity regions 74 in the n-type well 72, and the power voltage is applied to the n-type well 72. A ground line GND is connected to the p-type impurity region 75 between the n-type wells 71 and 72, and the p-type silicon substrate 70 is biased to the ground level. An input terminal 60 is connected to the p-type impurity region 75 in the n-type well 72 and the n-type impurity region 74 in the n-type well 71. The p-type impurity region 75 and the n-type well 72 form a diode 61, and the p-type silicon substrate 70 and the n-type well 71 form another diode 62. Thus, the two vertical diodes 61 and 62 are connected between the input terminal 60 and the power supply PW and between the input terminal 60 and the ground line GND as shown in FIG. 3, and offer discharging paths to the power supply line PW and the ground line GND.

When static charge is applied to the input terminal 60, the prior art vertical diodes 61/62 discharge the static charge current to the power supply line PW or the ground line GND, and protect circuit components such as metal-insulator-semiconductor type field effect transistors against the static charge. However, the prior art vertical diodes 61/62 hardly protect miniature metal-insulator-semiconductor type field effect transistors against the static charge. In fact, the static charge is liable to damage the gate insulators of the miniature metal-insulator-semiconductor type field effect transistors.

SUMMARY OF THE INVENTION

It is therefore an important object of the present invention to provide a protection circuit, which effectively prevents circuit components designed under 0.5 micron rules or less from static charge.

It is also an important object of the present invention to provide a process for fabricating the protection circuit.

The present inventor contemplated the problem inherent in the prior art vertical diodes 61/62, and noticed that the miniaturization resulted in the gate voltage higher than the clamp voltage of the vertical diodes 61/62. In detail, FIG. 4 illustrated the voltage-to-current characteristics of the prior art vertical diodes 61/62. When static charge was applied to the input terminal 60, the vertical diode 62 started to flow static charge current at a breakdown voltage V1, and the amount of current was increased together with the static voltage. When the prior art semiconductor integrated circuit was designed under 0.5 micron rules, the breakdown voltage V1 was 8 volts to 10 volts, and was approximately equal to the breakdown voltage of metal-insulator-semiconductor type field effect transistors of an input circuit to be protected. If the static charge current was Id, the gate voltage was increased to V2, and the gate voltage V2 was higher than the breakdown voltage V1. Thus, the voltage V2 higher than the breakdown voltage V1 was applied to the gate electrodes of the metal-insulator-semiconductor type field effect transistors, and the high voltage V2 was liable to damage the gate insulators of the field effect transistors.

To accomplish the object, the present invention proposes to reduce a base resistance.

In accordance with one aspect of the present invention, there is provided a semiconductor integrated circuit device fabricated on a semiconductor substrate of one conductivity type, and the semiconductor integrated circuit device comprises shallow trench isolating regions having a first depth and formed in surface portions of the semiconductor substrate for defining active areas therebetween, a terminal formed on the semiconductor substrate and unavoidably applied with static charge, a circuit component of an integrated circuit formed in one of the active areas and connected between the terminal and a first source of constant voltage and a protection circuit protecting the circuit component from the static charge, formed in at least the aforesaid one of the active areas and including a first impurity region of the aforesaid one conductivity type formed under the aforesaid at least one of the active areas and serving as a base region of a bipolar transistor, a second impurity region of the other conductivity type opposite to the aforesaid one conductivity type formed in a surface portion of the first impurity region, connected to the terminal and serving as one of an emitter region and a collector region of the bipolar transistor and a third impurity region of the other conductivity type connected to a second source of constant voltage, formed in another surface portion of the semiconductor substrate in such a manner that static charge flows through the first impurity region without substantial resistance due to the shallow trench isolating regions and serving as the other of the emitter region and the collector region of the bipolar transistor.

In accordance with another aspect of the present invention, there is provided a process for fabricating a semiconductor integrated circuit device comprising the steps of a) preparing a semiconductor substrate having one conductivity type, b) introducing a first dopant impurity into a surface portion of the semiconductor substrate for forming a first impurity region of the other conductivity type opposite to the one conductivity type, c) introducing a second dopant impurity into a surface portion of the first impurity region for forming a second impurity region shallower than the first impurity region and having the one conductivity type, d) forming a groove shallower than the second impurity region in a surface portion of the second impurity region, e) filling the groove with insulating material for forming a shallow trench isolating region and f) introducing a third dopant impurity into another surface portion of the second impurity region for forming a third impurity region of the one conductivity type shallower than the second impurity region, the first impurity region, the second impurity region and the third impurity region serving as an emitter region, a base region and a collector region of a vertical bipolar transistor for discharging static charge current applied to a terminal connected to the third impurity region.

BRIEF DESCRIPTION OF THE DRAWINGS

The features and advantages of the semiconductor device and the method will be more clearly understood from the following description taken in conjunction with the accompanying drawings in which:

FIG. 1A is a cross sectional view showing the standard isolation incorporated in the semiconductor integrated circuit;

FIG. 1B is a cross sectional view showing the prior art shallow trench isolation;

FIGS. 17A to 17F are cross sectional views showing a process for fabricating a protection circuit according to the present invention.

DESCRIPTION OF THE PREFERRED EMBODIMENTS

First Embodiment

Figure 2:
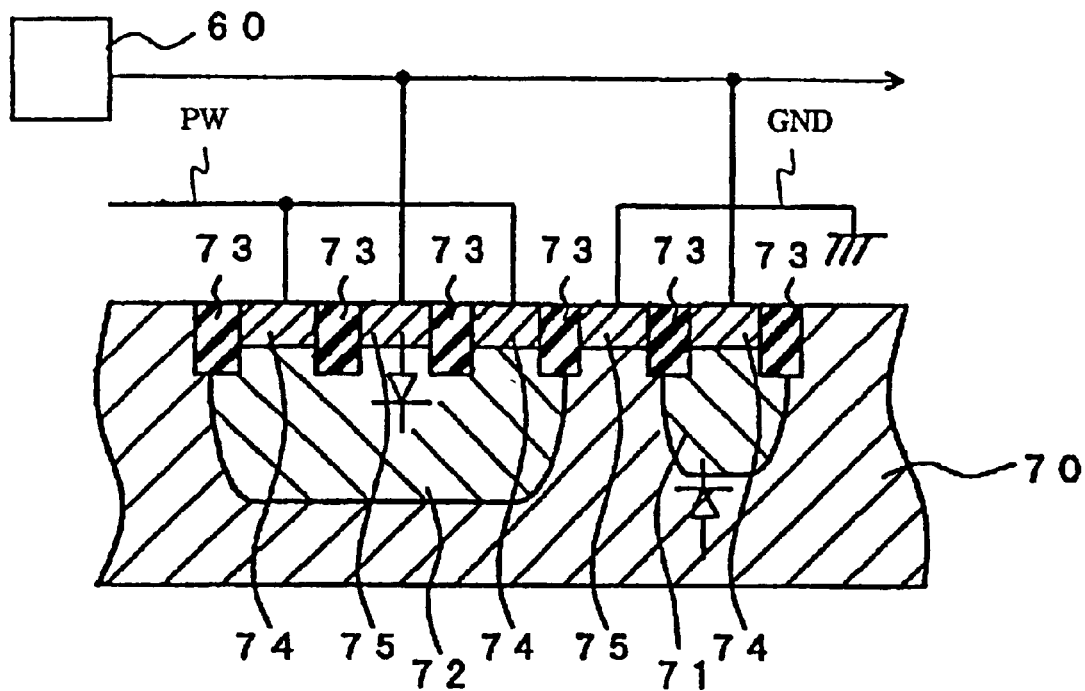
FIG. 2 is a cross sectional view showing the structure of the prior art vertical diode disclosed in the Proceedings.
Figure 3:
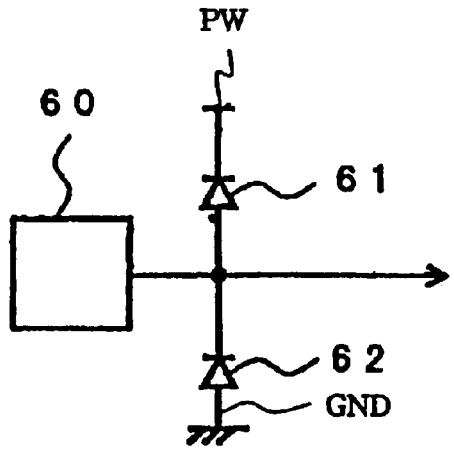
FIG. 3 is a circuit diagram showing the equivalent circuit of the prior art vertical diode.
Figure 4:
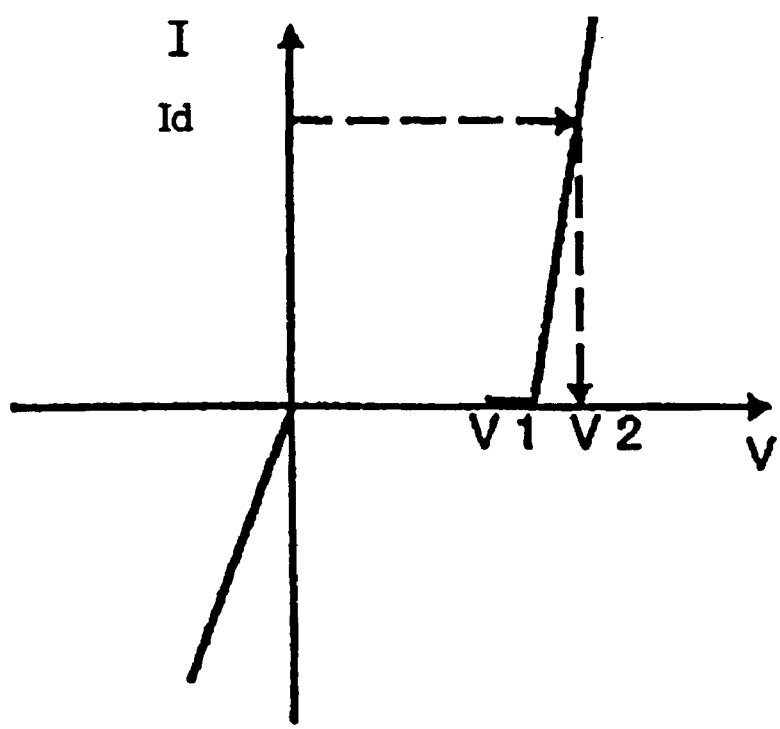
FIG. 4 is a graph showing the voltage-to-current characteristics of the prior art vertical diode.
Figure 5:
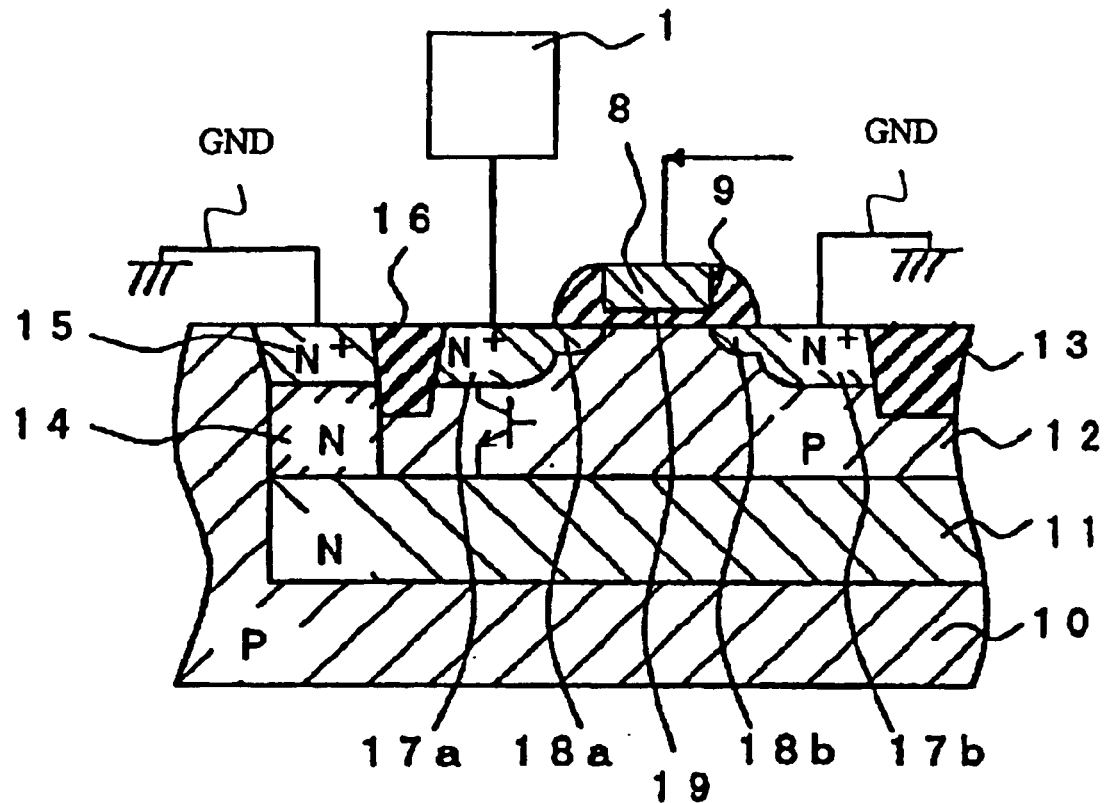
FIG. 5 is a cross sectional view showing the structure of a protection circuit according to the present invention.
Figure 6:
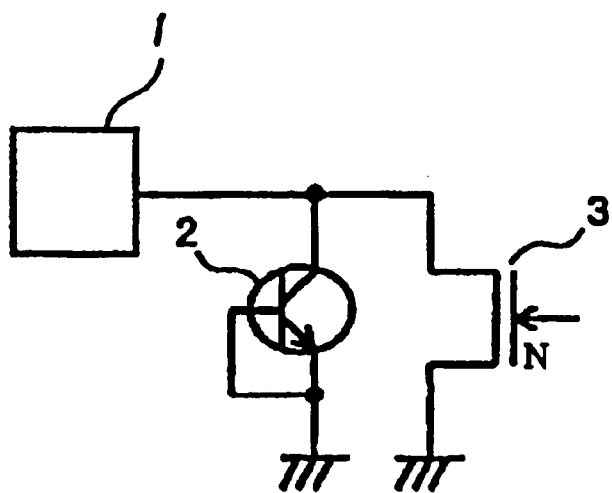
FIG. 6 is a circuit diagram showing an equivalent circuit of the protection circuit.

FIG. 5 illustrates the structure of a part of a semiconductor integrated circuit device assigned to a protection circuit embodying the present invention and a circuit component to be protected. Reference numeral 1 designates an output terminal. The protection circuit is connected between the output terminal 1 and a ground line GND in parallel to the circuit component to be protected as shown in FIG. 6. The protection circuit is implemented by an n-p-n type vertical bipolar transistor 2, and the circuit component to be protected is an n-channel enhancement type field effect transistor 3 serving as a part of a complementary field effect transistor, i.e., a series combination of the n-channel enhancement type field effect transistor 3 and a p-channel enhancement type field effect transistor (not shown). An internal circuit (not shown) supplies an output signal to the gate electrode of the n-channel enhancement type field effect transistor 3 and the gate electrode of the p-channel enhancement type field effect transistor, and the n-channel enhancement type field effect transistor and the p-channel enhancement type field effect transistor complementarily turn on and off so as to selectively connect the output terminal 1 to the ground line GND and the power supply line (not shown).

A p-type semiconductor substrate 10 is used for the semiconductor integrated circuit device. An n-type deep well 11 is formed in the p-type semi-conductor substrate 10, and a p-type well 12 is formed on a central area of the upper surface of the n-type deep well 11. An n-type well 14 is formed on a peripheral area of the upper surface of the n-type deep well 11, and form a p-n junction with the p-type well 12. A heavily-doped n-type impurity region 15 is formed over the n-type well 14.

The shallow trench isolation is employed in the semiconductor structure. Shallow trench isolating regions 13/16 are formed inside the heavily-doped n-type region 15, and penetrate into the p-type well 12. The shallow trench isolating regions 13/16 are deeper than the heavily-doped n-type impurity region 15, and reach the inner side surface of the n-type well 14.

Heavily-doped n-type source/drain regions 17a/17b are formed in the p-type well 12, and are spaced from each other. Lightly-doped n-type source/drain regions 18a/18b are formed inside of the heavily-doped n-type source/drain regions 17a/17b, respectively, and are contiguous to the heavily-doped n-type source/drain regions 17a/17b. A surface portion of the p-type well 12 serves as a channel region, and the channel region spaces the lightly-doped n-type drain region 18a from the lightly-doped n-type source region 18b. The channel region and the lightly-doped n-type source/drain regions 18a/18b are covered with a gate insulating layer 19, and a gate electrode 8 is formed on the gate insulating layer 19. The inner ends of the lightly-doped n-type source/drain regions 18a/18b are self-aligned with both side surfaces of the gate electrode 8, respectively. Side wall spacers 9 are formed on both sides of the gate electrode 8, and the inner ends of the heavily-doped n-type source/drain regions 17a/17b are self-aligned with the outer ends of the side wall spacers 9, respectively. The output terminal 1 is connected to the heavily-doped n-type drain region 17a, and the heavily-doped n-type source region 17b and the heavily-doped n-type impurity region 15 are connected to the ground line GND.

The heavily-doped n-type source/drain regions 17a/17b, the lightly-doped n-type source/drain regions 18a/18b, the channel region, the gate insulating layer 19, the gate electrode 8 and the side wall spacers 9 as a whole constitute the n-channel enhancement type field effect transistor 3.

On the other hand, the heavily-doped n-type drain region 17a and the p-type well 12 serve as a collector region and a base region of the n-p-n type vertical bipolar transistor 2. The n-type deep well 11, the n-type well.14 and the heavily-doped n-type impurity region serve as an emitter region. Thus, the heavily-doped n-type drain region 17a, the p-type well 12, the n-type deep well 11, the n-type well 14 and the heavily-doped n-type impurity region 15 form in combination the n-p-n type vertical bipolar transistor 2.

The n-type deep well 11 forms a part of the emitter region, and is provided just under the heavily-doped n-type drain region 17a serving as the collector region. For this reason, collector current easily flows through the p-type well 12 or the base region, and the base resistance is much smaller than that of the prior art lateral bipolar transistor. This means that the n-p-n type vertical bipolar transistor 2 can flow the electric current much more than the prior art n-p-n type lateral bipolar transistor.

Figure 7:
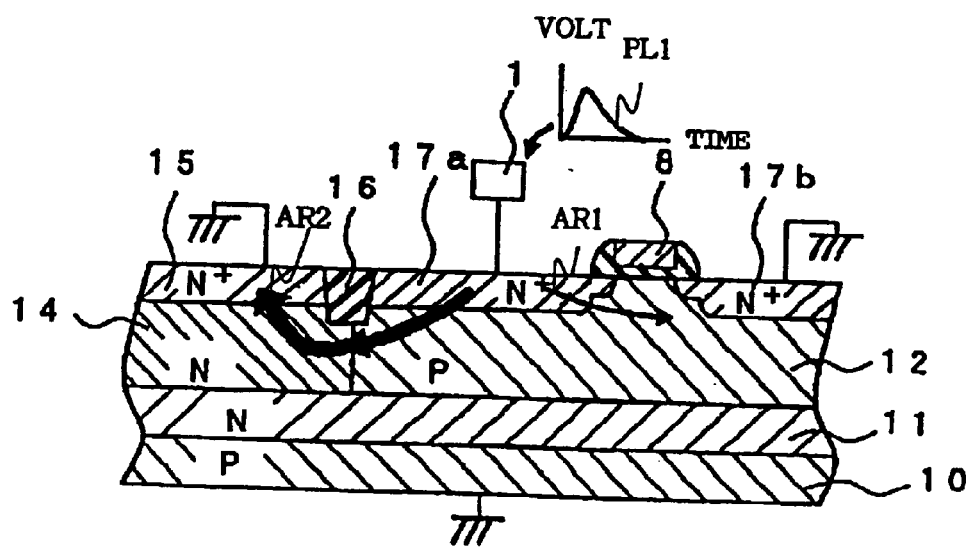
FIG. 7 is a view showing current paths created in the protection circuit and potential drop at an output terminal.

The heavily-doped n-type drain region 17a serves as the emitter region, and, accordingly, is shared between the n-channel enhancement type field effect transistor 3 and the n-p-n type vertical bipolar transistor 2. This results in reduction of occupation area assigned to the n-p-n type vertical bipolar transistor 2. When excess voltage is applied to the output terminal 1, the protection circuit behaves as follows. The excess voltage causes the punch-through phenomenon to take place between the heavily-doped n-type drain region 17a and the heavily-doped n-type source region 17b, and punch-through current flows as indicated by arrow AR1 (see FIG. 7). The excess voltage further makes the n-p-n type vertical bipolar transistor 2 turn on. As described hereinbefore, the n-p-n type vertical bipolar transistor 2 flows a large amount of electric current from through the p-type well 12 to the n-type deep well 11, and further flows from the n-type deep well 11 through the n-type well 14 and the heavily-doped n-type impurity region 15 to the ground line GND as indicated by arrow AR2. Thus, the n-p-n type vertical bipolar transistor 2 rapidly reduces the potential level at the output terminal 1 and, accordingly, in the heavily-doped n-type drain region 17a by virtue of the large amount of the discharge current (see plots PL1), and prevents the n-channel enhancement type field effect transistor 3 from destruction.

Figure 8:
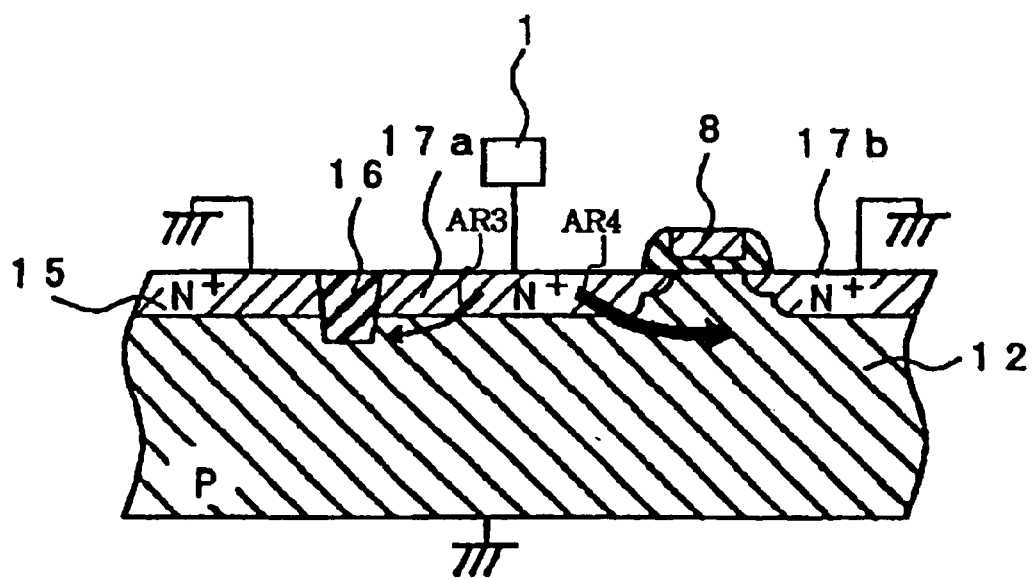
FIG. 8 is a cross sectional view showing current paths created in the prior art lateral bipolar transistor and a circuit component to be protected.

If the prior art lateral bipolar transistor 15/12/17a is associated with the n-channel enhancement type field effect transistor 3 as shown in FIG. 8, the amount of discharge current AR3 is much smaller than the amount of punch-through current AR4 due to the large base resistance, and the n-channel enhancement type field effect transistor is much liable to be damaged.

Figure 9:
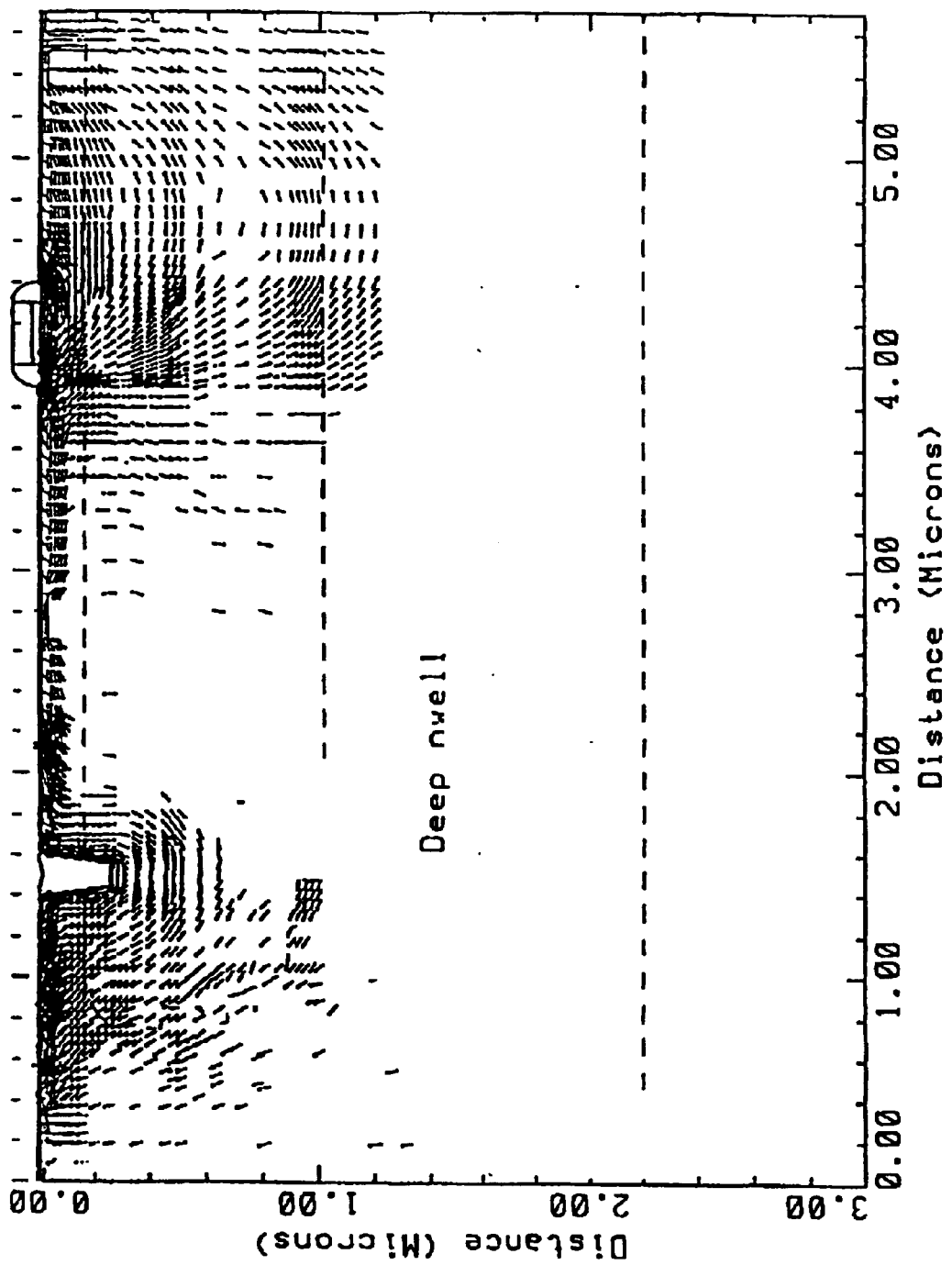
FIG. 9 is a view showing a distribution of current density in an n-p-n type vertical bipolar transistor obtained through a computer simulation.

The present inventor evaluated the protection circuit through a computer simulation. The protection circuit was implemented by the n-p-n type vertical bipolar transistor 2 shown in FIG. 5, and the n-channel enhancement type field effect transistor 3 is connected in parallel to the n-p-n type vertical bipolar transistor 2. The present inventor simulated the behavior of the n-p-n type vertical bipolar transistor 2 under application of a static charge pulse for a human body model. The static charge pulse was assumed to be 2000 volts. After the n-p-n type vertical bipolar transistor 2 turned on, the current density was distributed at the maximum discharge current as shown in FIG. 9. From the computer simulation, it was understood that the n-p-n type vertical bipolar transistor 2 flew the discharge current as much as the n-channel enhancement type field effect transistor 3.

Figure 10:
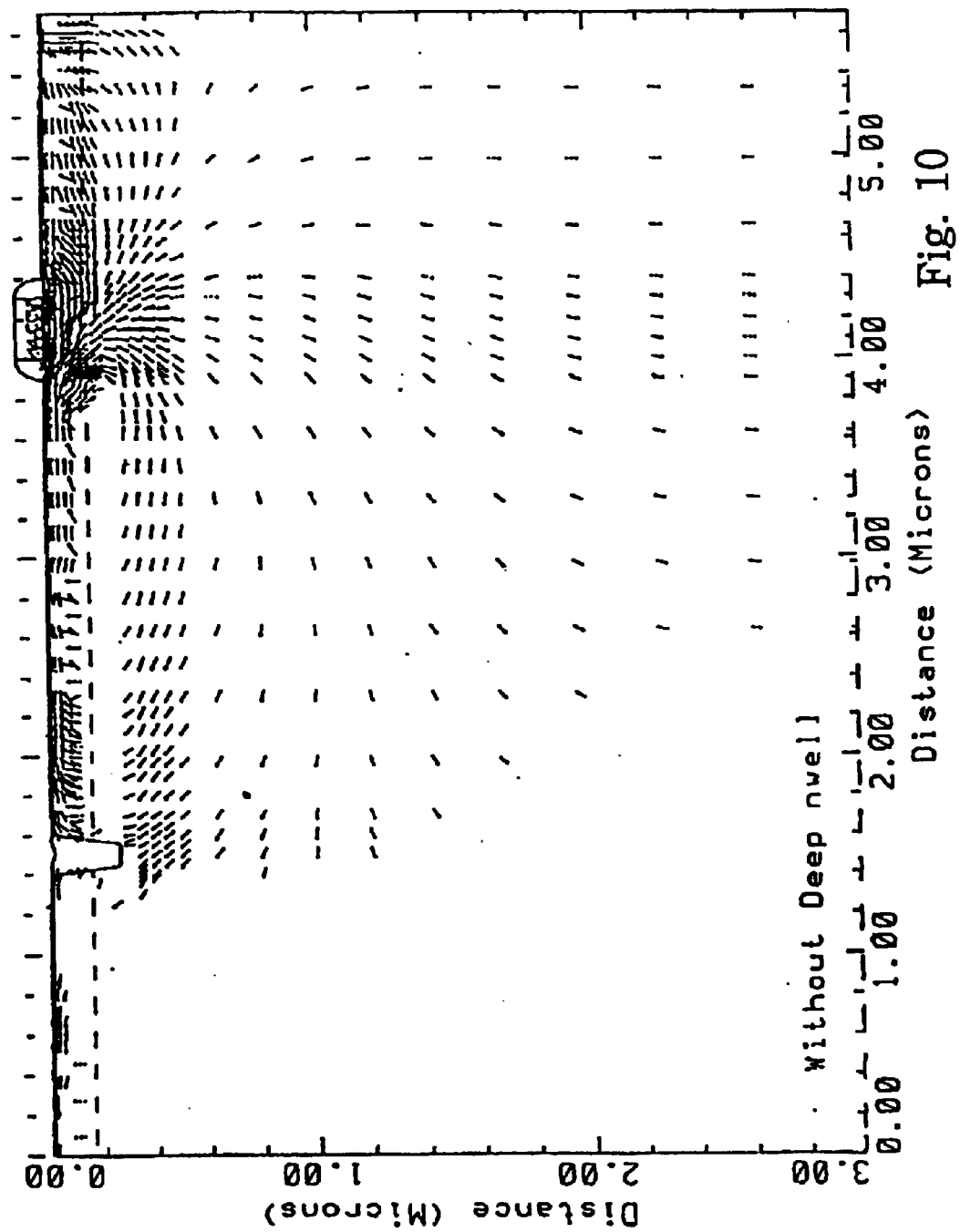
FIG. 10 is a view showing a distribution of current density in an n-p-n type lateral bipolar transistor obtained through the computer simulation.

The present inventor further simulated the behavior of an n-p-n type lateral bipolar transistor under the same conditions. The n-type well 14 and the n-type deep well 11 were deleted from the structure shown in FIG. 5 as similar to the prior art n-p-n type lateral bipolar transistor. The current density was distributed as shown in FIG. 10. The n-p-n type lateral bipolar transistor flew the discharging current less than that of the n-channel enhancement type field effect transistor 3. Comparing FIG. 9 with FIG. 10, it was understood that the emitter region under the collector region was effective against the destruction of the circuit component to be protected.

In the first embodiment, the p-type well 12 and the heavily-doped n-type drain region 17a serve as a first impurity region and a second impurity region, respectively. The heavily-doped n-type impurity region 15, the n-type well 14 and the n-type deep well 11 as a whole constitute a third impurity region.

Second Embodiment

Figure 11:
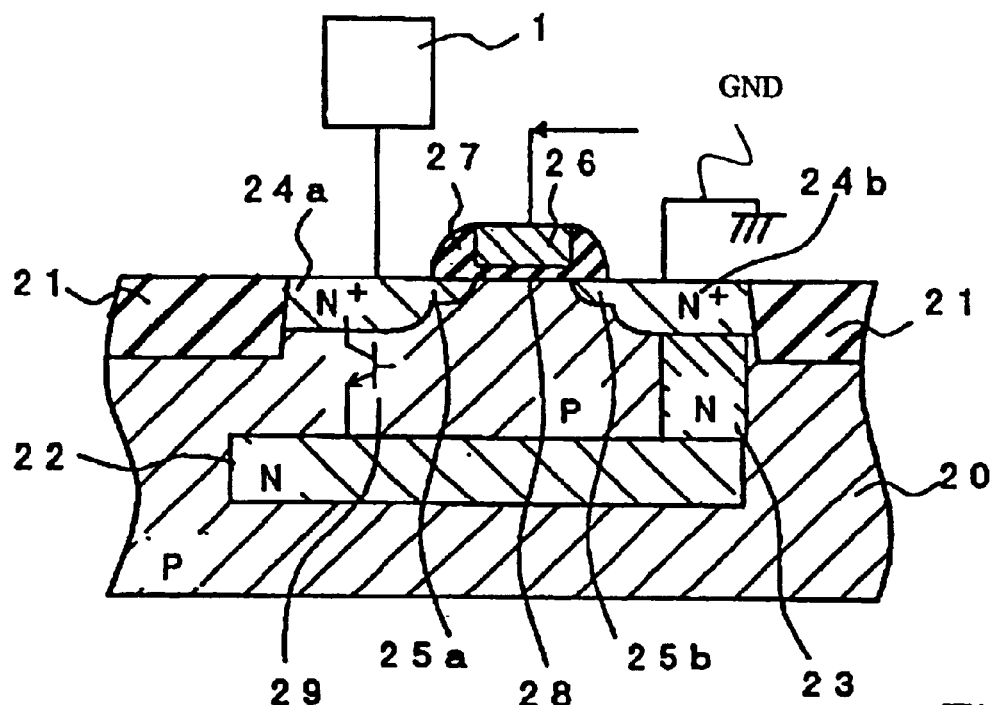
FIG. 11 is a cross sectional view showing the structure of another protection circuit according to the present invention.

FIG. 11 illustrates a protection circuit incorporated in another semi-conductor integrated circuit device embodying the present invention. The semiconductor integrated circuit is fabricated on a p-type semiconductor substrate 20, and shallow trench isolating regions 21 offer electrical isolation. An n-type deep well 22 is formed in the p-type semiconductor substrate 20, and an n-type well 23 is in contact with an upper surface of the n-type deep well 22. Heavily-doped n-type impurity regions 24a/24b are formed in surface portions of the p-type semiconductor substrate 20, and are spaced from each other. The heavily-doped n-type impurity region 24b is held in contact with the n-type well 23, and is electrically connected to the n-type deep well 22. Lightly-doped n-type impurity regions 25a and 25b project from the inner ends of the heavily-doped n-type impurity regions 24a/24b, respectively, and form the LDD (Lightly-Doped Drain) structure. A surface portion of the p-type semiconductor substrate 20 between the lightly-doped n-type impurity regions 25a and 25b serves as a channel region, and a gate structure is formed on the channel region. The gate structure includes a gate electrode 25, side wall spacers 27 on both sides of the gate electrode 25 and a gate insulating layer 28 beneath the gate electrode 26. The lightly-doped n-type impurity regions 25a/25b are self-aligned with the gate electrode 26, and the heavily-doped n-type impurity regions 24a/24b are self-aligned with the side wall spacers 27.

An output terminal 1 is connected to the heavily-doped n-type impurity region 24a, and the heavily-doped n-type impurity region 24a serves as a drain region. On the other hand, the other heavily-doped n-type impurity region 24b is connected to a ground line GND, and serves as a source region. The heavily-doped n-type impurity regions 24a/24b, the lightly-doped n-type impurity regions 25a/25b, the gate insulating layer 28, the gate electrode 26 and the side wall spacers 27 as a whole constitute an n-channel enhancement type field effect transistor, which in turn forms a part of a complementary output transistor. An output signal is supplied from an internal circuit (not shown) to the gate electrode 26.

The heavily-doped n-type impurity regions 24a and 24b are shared between the n-channel enhancement type field effect transistor and an n-p-n type vertical bipolar transistor 29. The heavily-doped n-type impurity region 24a and the p-type semiconductor substrate 20 thereunder serve as a collector region and a base region, respectively, and the n-type deep well 22, the n-type well 23 and the heavily-doped n-type impurity region 24b form in combination an emitter region.

The protection circuit is implemented by the n-p-n type vertical bipolar transistor 29, and the n-p-n type vertical bipolar transistor 29 behaves as similar to the n-p-n type vertical bipolar transistor 2. The n-p-n type vertical bipolar transistor occupies an area narrower than that of the n-p-n type vertical bipolar transistor 2, because both of the heavily-doped n-type impurity regions 24a/24b are shared between the n-channel enhancement type field effect transistor and the n-p-n type vertical bipolar transistor 29.

In the second embodiment, the p-type well 20 and the heavily-doped n-type impurity region 24a serve as a first impurity region and a second impurity region, respectively. The heavily-doped n-type impurity region 24b, the n-type well 23 and the n-type deep well 22 as a whole constitute a third impurity region.

Third Embodiment

Figure 12:
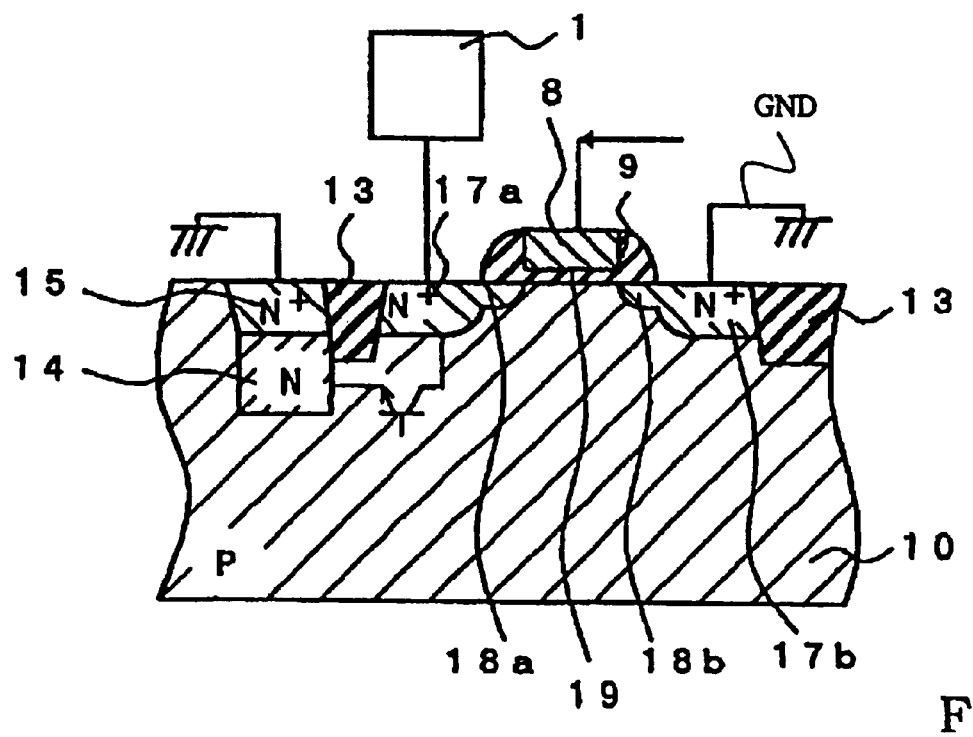
FIG. 12 is a cross sectional view showing the structure of yet another protection circuit according to the present invention.

FIG. 12 illustrates a protection circuit incorporated in yet another semi-conductor integrated circuit device embodying the present invention. The protection circuit implementing the third embodiment is similar to the first embodiment except the n-type deep well 11. Other layers and regions are labeled with the same references designating corresponding layers and regions of the first embodiment without detailed description.

Comparing FIG. 12 with FIG. 5, it is understood that the n-type deep well 11 is deleted from the structure of the third embodiment. The heavily-doped n-type impurity region 15 and the n-type well 14 as a whole constitute an emitter region of an n-p-n type bipolar transistor serving as the protection circuit. The n-type well 14 is deeper than the shallow trench isolating region 13, and the base resistance is less than that of the prior art lateral bipolar transistor. Although the n-p-n type bipolar transistor has the base region larger in base resistance than that of the n-p-n type vertical bipolar transistor 2, the fabrication process is simpler than that for the n-p-n type vertical bipolar transistor 2.

In the third embodiment, the p-type well 10 and the heavily-doped n-type drain region 17a serve as a first impurity region and a second impurity region, respectively. The heavily-doped n-type impurity region 15 and the n-type well 14 as a whole constitute a third impurity region.

Fourth Embodiment

Figure 13:
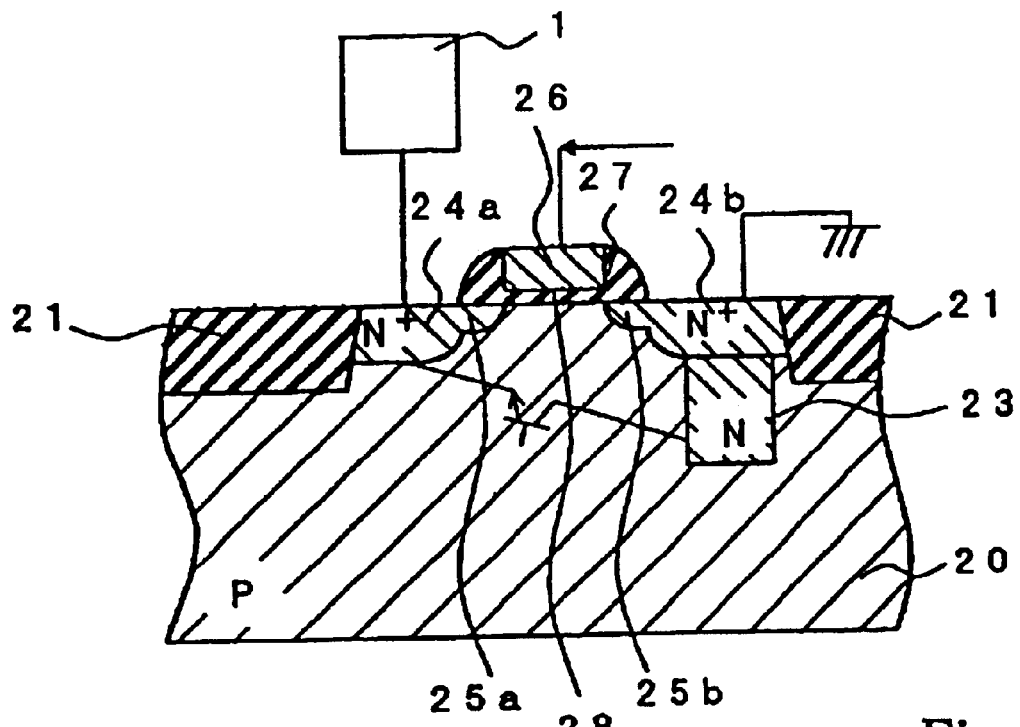
FIG. 13 is a cross sectional view showing the structure of still another protection circuit according to the present invention.

FIG. 13 illustrates a protection circuit incorporated in still another semi-conductor integrated circuit device embodying the present invention. The protection circuit implementing the fourth embodiment is similar to the second embodiment except the n-type deep well 22. Other layers and regions are labeled with the same references designating corresponding layers and regions of the second embodiment without detailed description.

Comparing FIG. 13 with FIG. 11, it is understood that the n-type deep well 22 is deleted from the structure of the fourth embodiment. The heavily-doped n-type impurity region 24b and the n-type well 23 as a whole constitute a collector region of an n-p-n type bipolar transistor serving as the protection circuit. The heavily-doped n-type impurity region 24a and the p-type semi-conductor substrate 20 serve as an emitter region and a base region, respectively. The shallow trench isolating regions 21 are outside of the heavily-doped n-type impurity regions 24a/24b, and any shallow trench isolating region is not formed in the base region. For this reason, the base resistance is less than that of the prior art lateral bipolar transistor. Although the n-p-n type bipolar transistor has the base region larger in base resistance than that of the n-p-n type vertical bipolar transistor 29, the fabrication process is simpler than that for the n-p-n type vertical bipolar transistor 29, because any n-type deep well is required.

In the fourth embodiment, the p-type well 20 and the heavily-doped n-type impurity region 24a serve as a first impurity region and a second impurity region, respectively. The heavily-doped n-type impurity region 24b and the n-type well 23 as a whole constitute a third impurity region.

Fifth Embodiment

Figure 14:
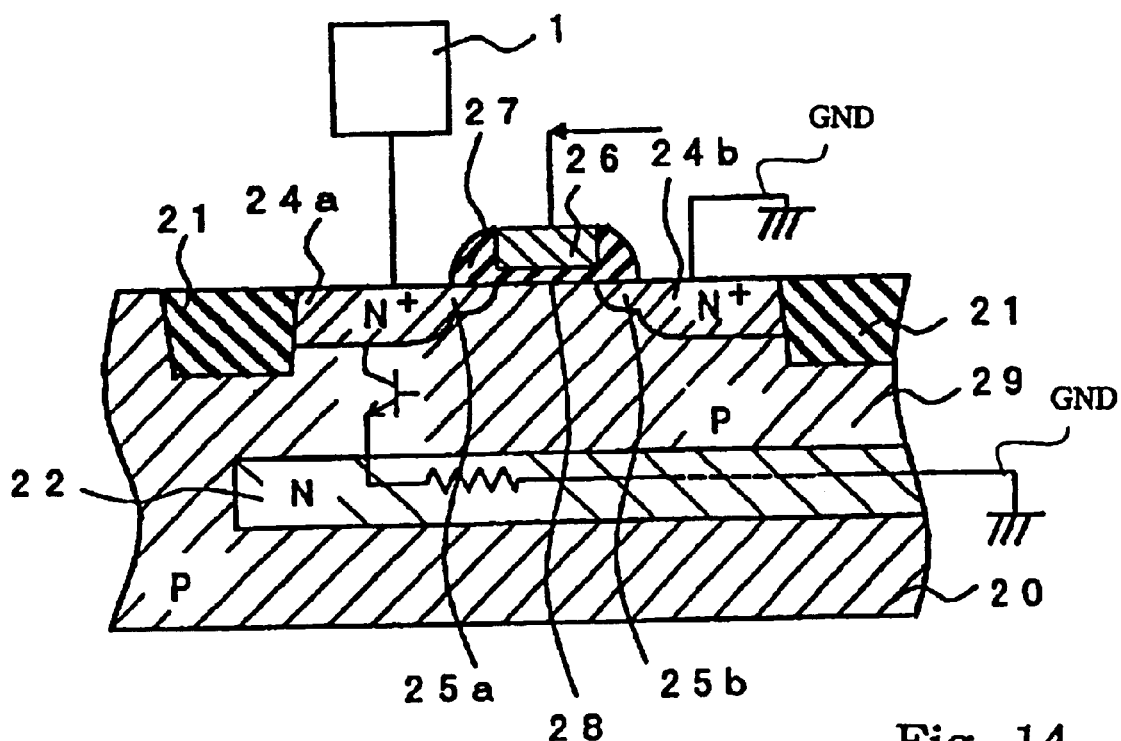
FIG. 14 is a cross sectional view showing the structure of yet another protection circuit according to the present invention.

FIG. 14 illustrates a protection circuit incorporated in yet another semi-conductor integrated circuit device embodying the present invention. The protection circuit implementing the fifth embodiment is similar to the second embodiment except the n-type well 23. Other layers and regions are labeled with the same references designating corresponding layers and regions of the second embodiment without detailed description.

The n-type well 23 is deleted from between the n-type deep well 22 and the heavily-doped n-type impurity region 24b. The n-type deep well 22 is elongated, and is connected to the ground line GND. For this reason, only the n-type deep well 22 serves as an emitter region of an n-p-n type vertical bipolar transistor serving as the protection circuit.

Although the elongated n-type deep well 22 increases the collector resistance, the fabrication process is simpler than that of the second embodiment, because the n-type well 23 is not required.

In the fifth embodiment, the p-type well 20 and the heavily-doped n-type impurity region 24a serve as a first impurity region and a second impurity region, respectively. The n-type deep well 22 serves as a third impurity region.

Sixth Embodiment

In the above-described embodiments, the protection circuit is connected to the output terminal 1. However, the protection circuit according to the present invention is available for an input/output circuit.

Figure 15:
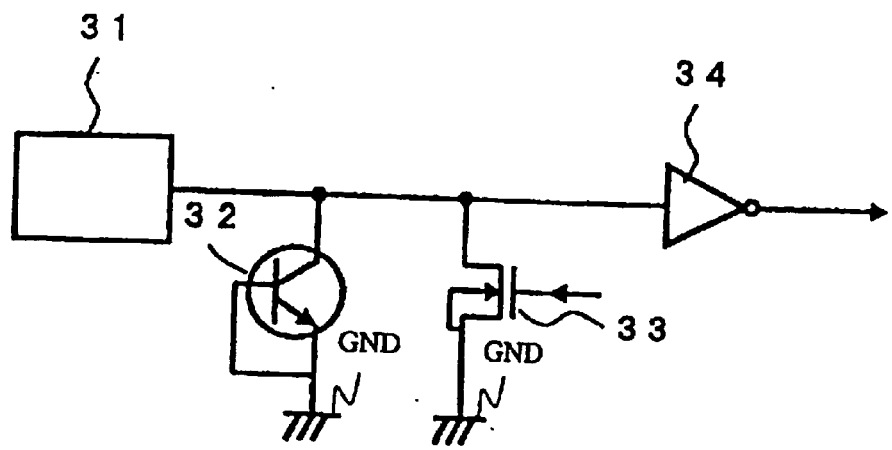
FIG. 15 is a circuit diagram showing a protection circuit for an input/output circuit.

FIG. 15 illustrates the protection circuit for an input/output circuit. An input/output terminal 31 is connected to an input inverter 34, and an n-p-n in type bipolar transistor 32 and an n-channel enhancement type output transistor 33 are connected in parallel between the input/output terminal 31 and a ground line GND. The n-channel enhancement type output transistor 33 is an open-drain transistor. Any one of the n-p-n type bipolar transistors implementing the first embodiment to the sixth embodiment is used as the n-p-n type bipolar transistor 32.

Figure 16:
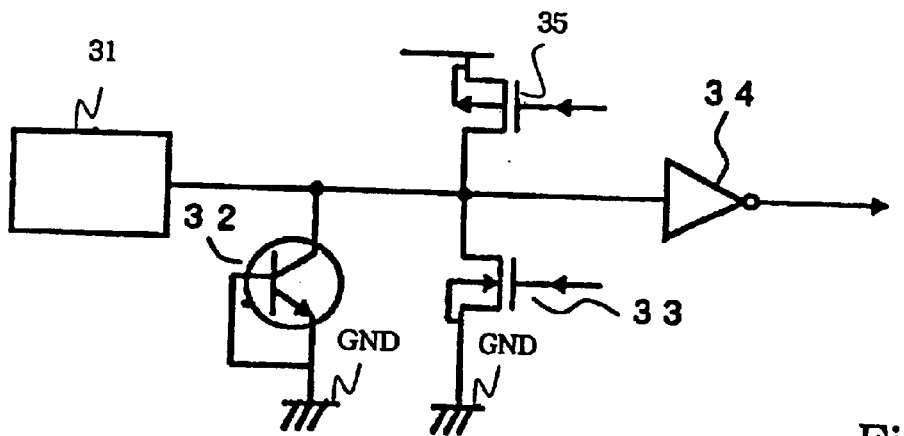
FIG. 16 is a circuit diagram showing the protection circuit for another input/output circuit.

FIG. 16 illustrates the protection circuit for another input/output circuit. The input/output circuit includes an input inverter 34 and a push-pull circuit. The n-channel enhancement type field effect transistor 33 and a p-channel enhancement type field effect transistor 35 form in combination the push-pull circuit. The p-channel enhancement type field effect transistor 35 is connected between a power supply line and the input/output terminal 31.

Process

FIGS. 17A to 17F illustrate a process for fabricating a protection circuit according to the present invention. The process starts with preparation of the p-type semiconductor substrate 10. The p-type semiconductor substrate 10 is doped with boron at $1 \times 10^{15}/cm^3$. Phosphorous is ion implanted into the surface portion of the p-type semiconductor substrate 10 (see FIG. 17A), and, thereafter, is treated with heat. The phosphorous forms the n-type well 11 at $1 \times 10^{16}/cm^3$, and the n-type well 11 is of the order of 2 microns deep.

Subsequently, boron is ion implanted into the n-type well 11 (see FIG. 17B), and, thereafter, is treated with heat. The boron forms the p-type well 12 at $1 \times 10^{17}/cm^3$, and the p-type well 12 is 1 micron deep.

Figure 17A:
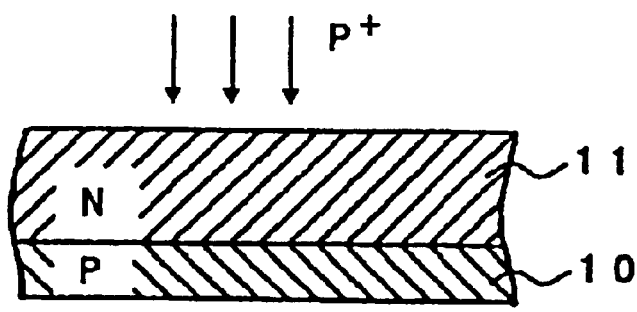
Figure 17B:
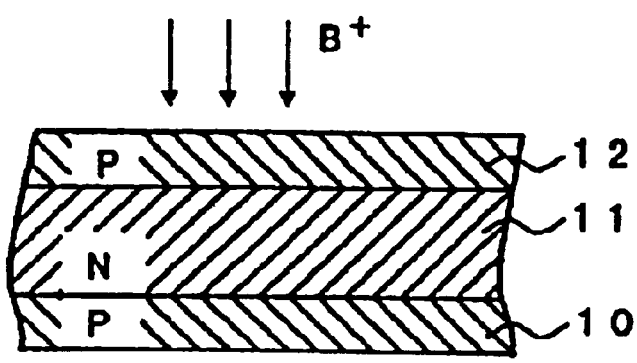
Figure 17C:
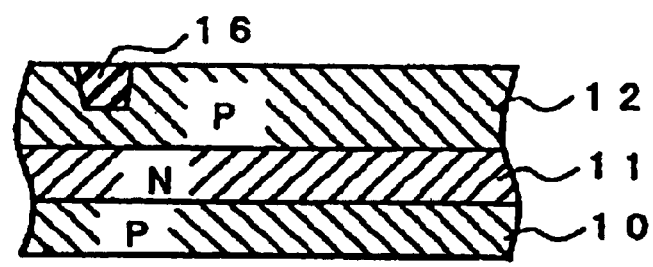

Subsequently, a trench is formed in the p-type well 12 by using a photo-lithography and an etching technique, and is 0.4 micron deep. The trench is filled with silicon oxide, and the silicon oxide in the trench forms the shallow trench isolating region 16 as shown in FIG. 17C.

Figure 17D:
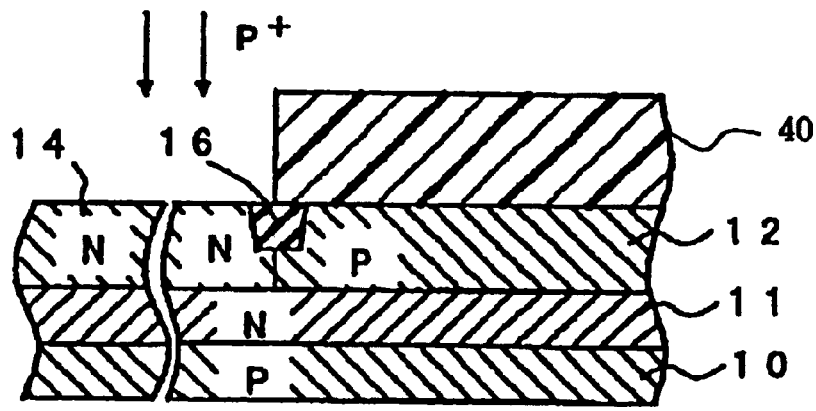

Subsequently, photo-resist is spread over the entire surface of the p-type well 12, and is baked so as to form a photo-resist layer. A pattern is transferred from a photomask (not shown) to the photo-resist layer, and a latent image is formed in the photo-resist layer. The latent image is developed, and a photo-resist ion-implantation mask 40 is left on the p-type well 12. The area assigned to the n-channel enhancement type field effect transistor is covered with the photo-resist ion-implantation mask 40. Phosphorus is ion implanted into the exposed area as shown in FIG. 17D, and forms the n-type well 14 concurrently with other n-type wells for p-channel field effect transistors. The n-type well 14 is doped at $2 \times 10^{27}/cm^3$, and is 1 micron deep. After the ion-implantation, the photo-resist ion-implantation mask 40 is stripped off.

Subsequently, the gate insulating layers are grown, and polysilicon is deposited over the entire surface. The polysilicon layer is patterned into the gate electrodes 8 by using the photo-lithography and an etching technique. Using the gate electrodes 8 as an ion-implantation mask, phosphorous is ion implanted into the p-type well 12, and forms the lightly-doped n-type impurity regions 18a and 18b as shown in FIG. 17E. In this instance, the lightly-doped n-type impurity regions 18a and 18b are doped at $2 \times 10^{18}/cm^3$, and are 0.1 micron deep.

Subsequently, the side wall spacers 9 are formed on both side surfaces of each gate electrode 8. The side wall spacers 9 may be formed as follows. Silicon oxide is deposited over the entire surface of the resultant semiconductor structure, and the silicon oxide layer is anisotropically etched so as to be formed into the side wall spacers 9.

A photo-resist ion-implantation mask (not shown) is formed on the area assigned to the p-channel field effect transistors. Using the side wall spacers 9 as an ion-implantation mask, arsenic is ion implanted, and forms the heavily-doped n-type source/drain regions 17a and 17b. The heavily-doped n-type source/drain regions 17a and 17b are doped at $1 \times 10^{20}/cm^3$, and are 0.2 micron deep. The photo-resist ion-implantation mask is stripped off, and a photo-resist ion-implantation mask (not shown) is formed on the area assigned to the n-channel enhancement type field effect transistor. Using the side wall spacers 9 as an ion-implantation mask, boron difluoride ($BF_2^+$) is ion implanted into the n-type well so as to form p-type source/drain regions for the p-channel field effect transistors. The resultant semiconductor structure is shown in FIG. 17F. The photo-resist ion-implantation mask is stripped off.

As will be understood from the foregoing description, the fabrication process shown in FIGS. 17A to 17F is analogous to a process for fabricating a complementary transistor, and the n-p-n type bipolar transistor is fabricated during the fabrication of the field effect transistors.

The bipolar transistor according to the present invention has the base region lower in resistance than the base region of the prior art lateral bipolar transistor. Even though the bipolar transistor is designed under 0.5 micron rules, the bipolar transistor discharges a large amount of static charge current, and prevents the circuit component to be protected from the damage.

Although particular embodiments of the present invention have been shown and described, it will be apparent to those skilled in the art that various changes and modifications may be made without departing from the spirit and scope of the present invention.

The protection circuit according to the present invention may be connected to an input terminal.

The protection circuit may be implemented by a p-n-p type bipolar transistor. The circuit component to be protected may be a p-channel type field effect transistor. The emitter region and the collector region of the bipolar transistor may be exchangeable.

What is claimed is:

1. A semiconductor device comprising:

a semiconductor substrate of a first conductivity type;

shallow trench isolating regions having a first depth, and disposed in surface portions of said semiconductor substrate and defining active areas therebetween;

a first terminal connected to one of said active areas;
a second terminal connected to another of said active areas;
a circuit component connected between said first terminal and said second terminal; and
a protection circuit disposed adjacent to at least said one of said active areas, and comprising:
   a first impurity region of said first conductivity type disposed adjacent to said at least one of said active areas, wherein said first impurity region is a base region of a bipolar transistor,
   a second impurity region of a second conductivity type opposite to said first conductivity type disposed adjacent to said first impurity region, connected to said first terminal, wherein said second impurity region is one of an emitter region or a collector region of said bipolar transistor; and
   a third impurity region of said second conductivity type wherein said third impurity region is the other of said emitter region or said collector region of said bipolar transistor, said third impurity region disposed away from said active areas.

2. The semiconductor device as set forth in claim 1, wherein said third impurity region further comprises:
   a first impurity sub-region disposed in a surface portion of another active area adjacent to said one of said active areas; and
   a second impurity sub-region contiguous to a bottom surface of said first impurity sub-region and extending in said first impurity region under said second impurity region.

3. The semiconductor device as set forth in claim 2, wherein said first impurity sub-region comprises:
   a first portion contiguous to said second impurity sub-region; and
   a second portion heavier in dopant concentration than said first portion and connected to said second terminal.

4. The semiconductor device as set forth in claim 2, wherein said circuit component is a field effect transistor comprising source and drain regions of said second conductivity type disposed in said one of said active areas, and one of said source and drain regions is said second impurity region.

5. The semiconductor device as set forth in claim 1, wherein said third impurity region comprises:
   a first impurity sub-region disposed in another surface portion of said first impurity region spaced from said second impurity region; and
   a second impurity sub-region contiguous to a bottom surface of said first impurity sub-region and extending in said first impurity region under said second impurity region.

6. The semiconductor device as set forth in claim 5, wherein said first impurity sub-region comprises:
   a first portion contiguous to said second impurity sub-region; and
   a second portion heavier in dopant concentration than said first portion and connected to said second terminal.

7. The semiconductor device as set forth in claim 5, wherein said circuit component is a field effect transistor comprising source and drain regions disposed in said one of said active areas, wherein one of said source and drain regions is said second impurity region, and the other of said source and drain regions is said first impurity sub-region.

8. The semiconductor device as set forth in claim 1, wherein said third impurity region is disposed in another active area adjacent to said one of said active areas and having a second depth greater than said first depth.

9. The semiconductor device as set forth in claim 8, wherein said circuit component is a field effect transistor comprising source and drain regions disposed in said one of said active areas, and one of said source and drain regions is said second impurity region.

10. The semiconductor device as set forth in claim 1, wherein said third impurity region is disposed in another surface portion of said first impurity region and deeper than said second impurity region.

11. The semiconductor device as set forth in claim 10, wherein said circuit component is a field effect transistor comprising source and drain regions disposed in said one of said active areas, one of said source and drain regions is said second impurity region, and the other of said source and drain region is a part of said third impurity region.

12. The semiconductor device as set forth in claim 1, wherein said third impurity region extends in said first impurity region under said second impurity region.

13. The semiconductor device as set forth in claim 10, wherein said circuit component is a field effect transistor comprising source and drain regions disposed in said one of said active areas, and one of said source and drain regions is said second impurity region.

14. The semiconductor device as set forth in claim 1, wherein said first terminal is a signal output terminal, and said circuit component is an output transistor.

15. The semiconductor device as set forth in claim 1, wherein said first terminal is a signal input and output terminal, and said circuit component is an output transistor comprising a portion of an input and output circuit connected to said first terminal.

16. A semiconductor device comprising:
   a semiconductor substrate of a first conductivity type;
   a plurality of active areas disposed in a portion of said semiconductor substrate;
   at least one shallow trench isolation region disposed between said active areas;
   a first terminal connected to one of said active areas;
   a second terminal connected to another of said active areas;
   a circuit component connected between said first terminal and said second terminal; and
   a protection circuit disposed adjacent to at least said one of said active areas, said protection circuit comprising:
      a first impurity region of said first conductivity type disposed adjacent to at least one of said active areas, wherein said first impurity region is a base region of a bipolar transistor,
      a second impurity region of a second conductivity type opposite to said first conductivity type disposed in one of said active areas connected to said first terminal, wherein said second impurity region is one of an emitter region or a collector region of said bipolar transistor; and
      a third impurity region of said second conductivity type disposed in another portion of said semiconductor substrate away from said active areas, wherein said third impurity region is the other of said emitter region or said collector region of said bipolar transistor.

17. The semiconductor device as set forth in claim 16, wherein said circuit component is a field effect transistor.

18. The semiconductor device as set forth in claim 16, wherein said third impurity region further comprises:

a first impurity sub-region disposed in a surface portion of an active area adjacent to said at least one shallow trench isolation region; and a second impurity sub-region contiguous to a bottom surface of said first impurity sub-region.

19. The semiconductor device as set forth in claim 18, wherein said first impurity sub-region comprises a first portion contiguous to said second impurity sub-region.

20. The semiconductor device as set forth in claim 19, wherein said first impurity sub-region further comprises a second portion heavier in dopant concentration than said first portion and connected to said second terminal.

21. The semiconductor device as set forth in claim 16, wherein said at least one shallow trench isolation region has a first depth and said third impurity region has a second depth greater than said first depth.

22. The semiconductor device as set forth in claim 16, wherein the depth of said third impurity region is deeper than the depth of said second impurity region.

23. The semiconductor device as set forth in claim 16, wherein said third impurity region extends into said first impurity region under said second impurity region.

24. The semiconductor device as set forth in claim 16, wherein an upper surface of said third impurity region is contiguous with a bottom surface of said first impurity region.

25. The semiconductor device as set forth in claim 16, wherein said first impurity region is a p-type impurity region.

26. The semiconductor device as set forth in claim 16, wherein said second impurity region is a n-type impurity region.

27. The semiconductor device as set forth in claim 16, wherein said third impurity region is a n-type impurity region.

28. The semiconductor device as set forth in claim 16, wherein said first terminal is a signal output terminal and circuit component is an output transistor.

29. The semiconductor device as set forth in claim 16, wherein said first terminal is a signal input and output terminal, and said circuit component is an output transistor comprising a portion of an input and output circuit connected to said first terminal.

* * * * *